United States Patent
Bennett

[11] Patent Number: 6,024,579
[45] Date of Patent: Feb. 15, 2000

[54] ELECTRICAL CONNECTOR HAVING BUCKLING BEAM CONTACTS

[75] Inventor: Glenn Edward Bennett, Glendale, Ariz.

[73] Assignee: The Whitaker Corporation, Wilmington, Del.

[21] Appl. No.: 09/087,589

[22] Filed: May 29, 1998

[51] Int. Cl.[7] ....................................... H01R 9/09
[52] U.S. Cl. ................... 439/66; 439/67; 439/289
[58] Field of Search ................. 439/66, 67, 82, 439/289

[56] References Cited

U.S. PATENT DOCUMENTS

| | | | |
|---|---|---|---|
| 3,806,801 | 4/1974 | Bove | 324/72.5 |
| 4,027,935 | 6/1977 | Byrnes et al. | |
| 4,066,312 | 1/1978 | Faure | |
| 4,330,165 | 5/1982 | Sado | |
| 4,505,529 | 3/1985 | Barkus | |
| 4,593,961 | 6/1986 | Cosmo | |
| 4,752,231 | 6/1988 | Olsson | 439/66 |
| 4,793,814 | 12/1988 | Zifcak et al. | 439/66 |
| 4,843,315 | 6/1989 | Bayer et al. | 324/158 P |
| 4,956,913 | 9/1990 | Eck | 29/884 |
| 5,061,192 | 10/1991 | Chapin et al. | 439/66 |
| 5,163,837 | 11/1992 | Rowlette, Sr. | 439/91 |
| 5,174,763 | 12/1992 | Wilson | 439/66 |
| 5,237,743 | 8/1993 | Busacco et al. | 29/885 |
| 5,248,262 | 9/1993 | Busacco et al. | 439/66 |
| 5,324,205 | 6/1994 | Ahmad et al. | 439/66 |
| 5,337,893 | 8/1994 | Nami et al. | 206/329 |
| 5,399,101 | 3/1995 | Campbell et al. | 439/482 |
| 5,597,317 | 1/1997 | Hansell, III et al. | 429/289 |
| 5,608,966 | 3/1997 | Donner et al. | 29/884 |
| 5,611,696 | 3/1997 | Donner et al. | 439/66 |
| 5,759,048 | 6/1998 | Korsunsky et al. | 439/66 |

*Primary Examiner*—Steven L. Stephan
*Assistant Examiner*—J. F. Duverne

[57] ABSTRACT

The invention is directed to an electrical connector (10) having a housing (12) with a plurality of contacts (14,114) secured therein. The housing (12) has a top and a bottom surface. The contacts (14,114) extend through the housing (12) and outwardly from the top and bottom surfaces to provide a mating interface between two electrical devices (50). The housing (12) has a flexible member (18) disposed along the top and the bottom surfaces and the contacts (14,114) are secured within the housing (12) by engagement with the flexible membrane (18).

17 Claims, 4 Drawing Sheets

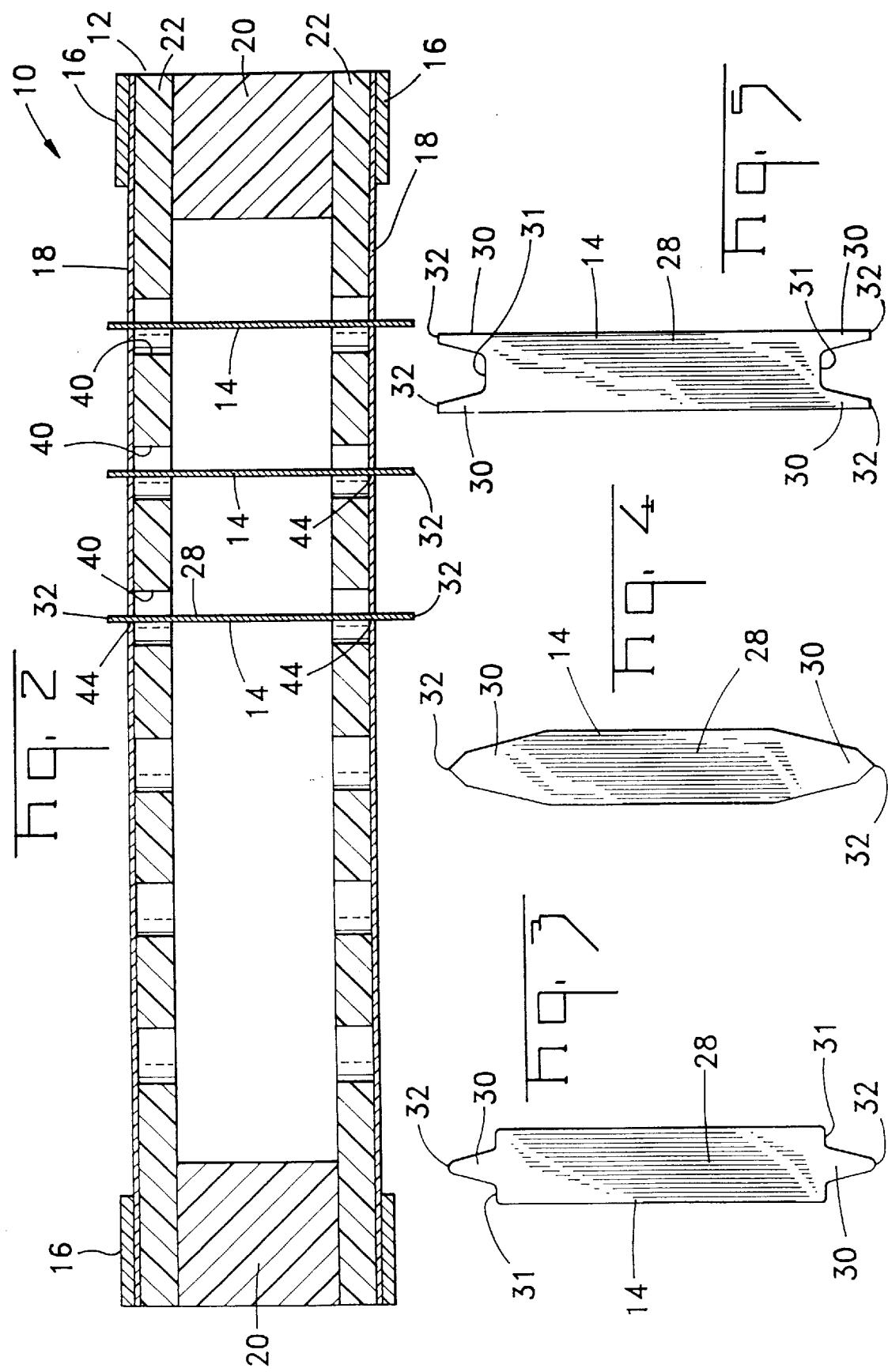

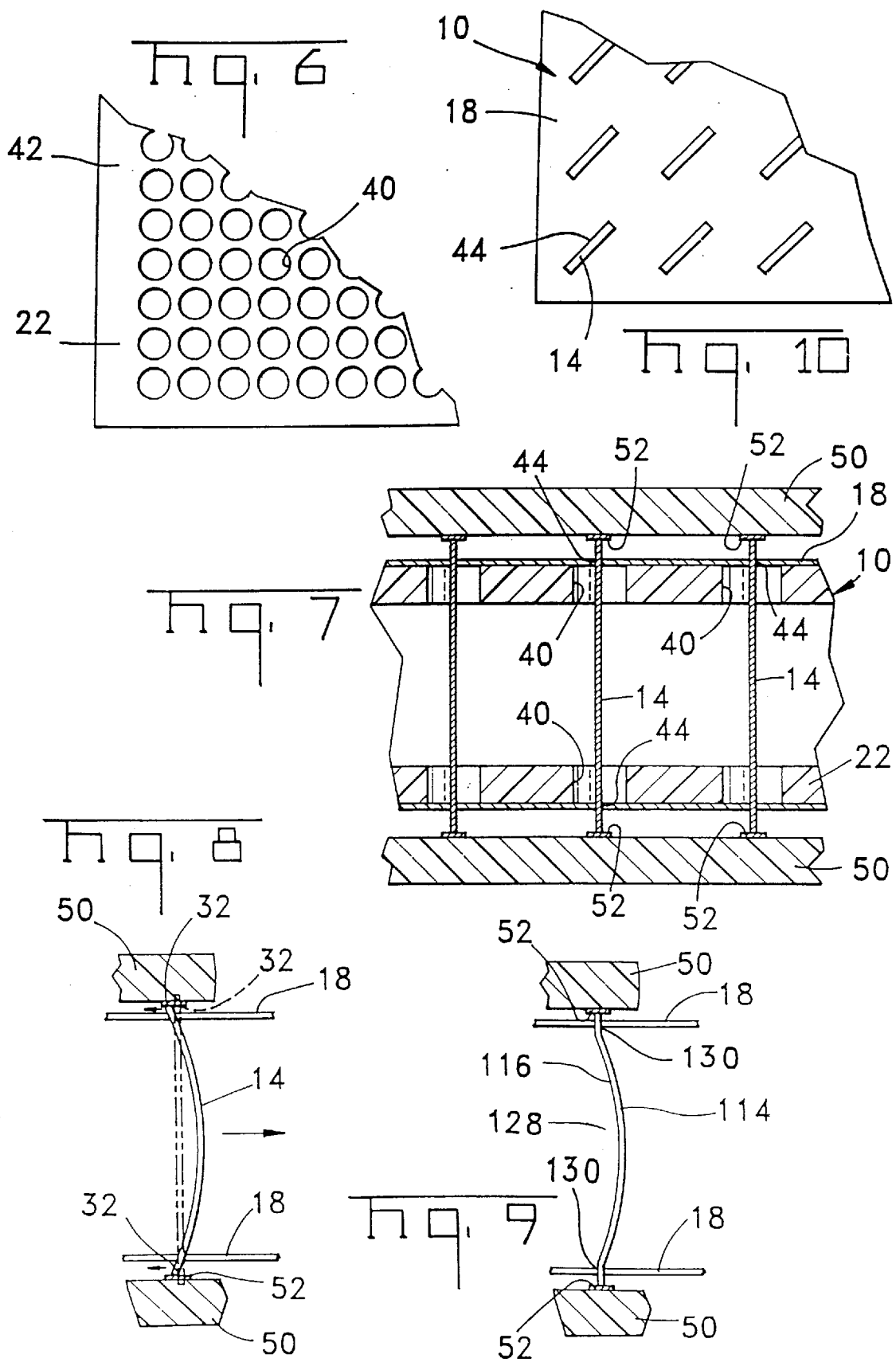

ELECTRICAL CONNECTOR HAVING BUCKLING BEAM CONTACTS

FIELD OF THE INVENTION

The invention is directed toward an electrical connector having contacts which are buckling column contacts, more specifically the electrical connector provides an area array interconnection.

BACKGROUND OF THE INVENTION

Area array contact structures provide a two dimensional planar pattern of contact sites. This would typically involve square or rectangular two dimensional arrays of PC board pads which must be connected to a corresponding array of sites in a connector or on the surface of a packaged electrical component, such as a land grid array (LGA) semi-conductor package. The current trend is directed toward designing such electrical connectors to provide interconnections as described above to provide both high density and high reliability connections between the various connection points. Higher reliability for such connections is essential due to potential end product failure should vital misconnections of these devices occur. It is also highly desired that such connections be separable and reconnectable in the field within the final product, as well as tolerant of dust and debris. Such a capability is also desirable during the manufacturing process to facilitate testing.

Shrinking packages and increased I/O requirements are driving the trend toward area array package configurations for microprocessor and ASIC chips, as well as other varieties ("chip scale packages"). Pin Grid Array (PGA) packages were an early area array configuration, but are now largely obsolete for new applications due to trace routing problems resulting from through-hole board mounting requirements. Ball Grid Array (BGA) packages replaced the PGA pins with small spherical balls of solder (63/37 SnPb), which reflow during mounting onto a pc board surface. BGA packages are difficult to socket because of the poor mechanical properties of the solder balls. LGA packages are simpler to manufacture than BGAs, and are potentially socketable. However, the socket must be a "Z-axis" socket, which delivers a clamping force to retain the chip in contact against the board, while overcoming the spring contacts within the socket. Since these chips may have 1000, 2000, and more contacts, this clamping force reaches into the hundreds of pounds when using conventional levels of individual contact force. The support structure and associated board stiffeners become unwieldy, expensive, and impractical. So there is substantial interest in reliable, low force contact systems.

At the same time, there is great demand for high speed performance from the chips and their sockets. This manifests itself as a requirement for contacts with low self inductance. Also, contact pitch is in the process of moving downward. Furthermore, contact working compliance is a requirement in a socket in order to absorb out-of-plane aspects of the mounting PC board and in the chip package as well.

U.S. Pat. No. 5,248,262 discloses an electrical connector for interconnecting a pair of circuit members. The connector includes a housing adapted for being located between the two circuit members. At least one elongated compressable contact member is secured within the housing. The contact occupies a first, prestressed position before engagement and is adapted for moving to a second, compressed position during the engagement. The electrical connector provides a two dimensional area array interconnect between the circuit members.

What is needed is a separable, low force, low inductance, high compliance, high density area array interconnect which provides a high pin count application with a high contact density and is manufactured in a cost productive manner.

SUMMARY OF THE INVENTION

The invention is directed to an electrical connector having a housing with a top surface and a bottom surface. An array of contacts is disposed within the housing. The contacts have middle sections and contact tips on either end of the contacts. The contacts are disposed within the housing such that the contact tips are exposed on the top and the bottom of the housing and the middle sections of the contacts are disposed in the interior of the housing. The contacts are secured to the top and bottom surface offset axially from the contact tips.

The invention is further directed to an electrical connector having a housing with a plurality of contacts secured therein. The housing has a top and a bottom surface. The contacts extend through the housing and outwardly from the top and bottom surface to provide a mating interface between two electrical devices. The housing has a flexible member disposed along the top and the bottom surfaces and the contacts are secured within the housing by engagement with the flexible membrane.

The invention is further directed to an electrical connector having a housing with a plurality of contacts secured therein, the housing having a top and a bottom surface. The contacts have middle sections and contact tips on either end of the contacts. The contacts extend through the housing and outwardly from the top and bottom surface such that the contact tips are exposed on the top and the bottom of the housing and the middle sections of the contacts are disposed in the interior of the housing to provide a mating interface between two electrical devices. The housing has a flexible member disposed along the top and the bottom surfaces and the contacts being secured within the housing by engagement with the flexible membrane offset axially from the contact tips.

The invention is also directed to an electrical connector having a housing with a top and a bottom surface. The top and the bottom surface each having a flexible membrane disposed thereover. The housing has a plurality of contacts disposed therein. The contacts are secured between the flexible membranes with contact tips extending through the flexible membranes for engagement with contact pads along both sides of the housing. The contacts are buckling beams, whereby as the contact tips engage contact pads on both sides, at a certain point, the contacts will bow.

BRIEF DESCRIPTION OF THE DRAWINGS

An embodiment of the present invention will now be described with reference to the accompanying drawings, in which:

FIG. 2 is a cross-sectional view taken along the line 2—2 in FIG. 1;

FIG. 3 is one embodiment of the contact to be used in the electrical connector;

FIG. 4 is an alternative embodiment of the contact;

FIG. 5 is a further embodiment of the contact;

FIG. 6 is a partial view of the support layer of the electrical connector;

FIG. 7 is a cross-sectional view of the electrical connector as it engages two devices;

FIG. 8 is partial cross-sectional view showing the buckling of the contact;

FIG. 9 is a an alternative embodiment of the contact of the electrical connector;

FIG. 10 is an alternative arrangement of the contacts to be disposed in the electrical connector;

DETAILED DESCRIPTION OF AN EMBODIMENT OF THE INVENTION

Figure 1:
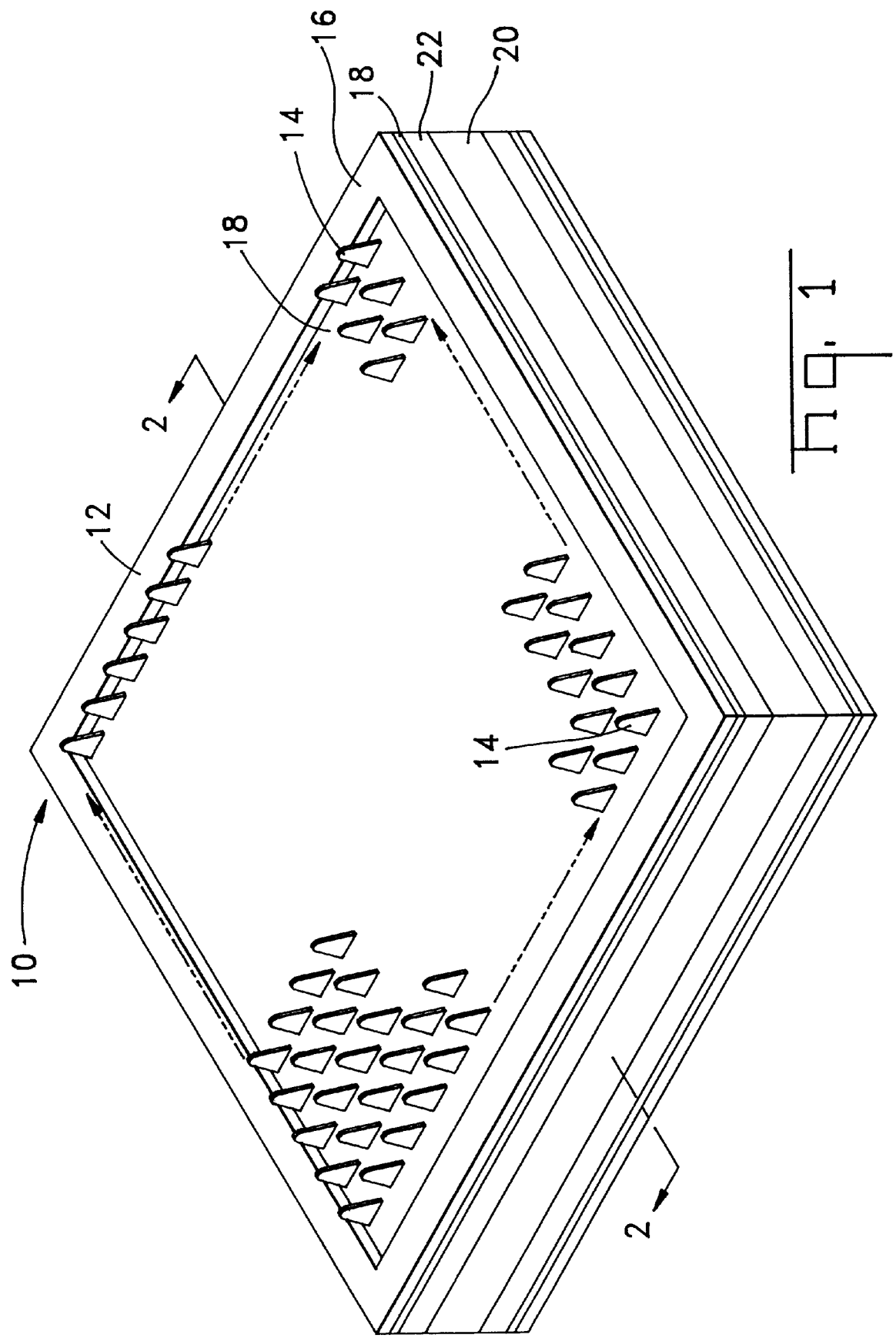
FIG. 1 is an isometric view of the electrical connector.

FIG. 1 shows an electrical connector 10 which, when combined with an associated clamping structure, is used to connect a two dimensional planar pattern of contact sites or contact pads with another. The electrical connector 10 provides an area array of contacts. This type of electrical connector is typically known as an interposer. In addition to joining a semiconductor package to a pc board, it could also provide other electrical interconnections. For example, the electrical connector could be used for cable to cable, cable to board, board to board, and other interconnections.

Electrical connector 10 comprises a housing 12 with an area array of contacts 14 disposed therein. FIG. 1 shows some contacts disposed within the housing 12, but it is to be understood that the whole housing 12 can be filled with electrical contacts 40. Electrical contacts 14 are disposed in several rows within the housing 12 in a close shoulder to shoulder spacing, however, the contacts 14 can also be arranged in another orientation in the housing 12. For example, the contacts 14 could be disposed in equal pitch side to side and row to row or they could be disposed diagonally as will be described in more detail later on.

The housing 12 is made up of two spacers 16, flexible members 18, sidewalls 20, and support layers 22. FIG. 2 shows a cross-sectional view of the assembled electrical connector 10 with a few of the contacts 14 inserted therein. As is obvious from the cross-sectional view in FIG. 2, the second spacer 16 is disposed along the bottom portion of the electrical connector housing 12 along with the second support layer 22 and the second flexible membrane 18.

While one contact 14 design has been shown in FIG. 1, various contacts, such as those shown in FIGS. 3–5, can be used interchangeably in the electrical connector 10 depending on the specific requirements of the connector 10.

Various contacts 14 will be described in which like features will have the same reference numeral. Contact 14, shown in FIG. 4, has a wide central section 28 and a tapered ends 30 which ends in contact points 32 disposed along each end of the contact 14.

Contact 14, shown in FIG. 3, has a wide central portion 28 with shoulders 31, tapered ends 30 which end in contact points 32 disposed along each end of the contact 14. When contacts 14 are inserted in the housing 12, shoulders 31 will engage the inner surface of the flexible membrane 18 thereby helping to secure the contact 14 within the housing 12.

Contact 14, as shown in FIG. 5, has wider central section 28, a central shoulder 31, with two legs 30 extending along either side of the central shoulder 31, each of the legs have contact points 32. When contact 14 is inserted in the housing 12, the central shoulders 31 will engage the inner surface of the flexible member 18, and the legs 30 will extend through the flexible member 18 and out of the housing 12. The engagement of the central shoulder 31 with the flexible member 18 will help to secure the contact 14 within the housing 12.

FIG. 6 shows a partial view of the support layer 22. The support layer 22 has the same shape as the housing 12 shown in FIG. 1. The support layer 22 has series of holes 40 through which the contact 14 will extend. With each contact centered by the membrane, these holes 40 have sufficient radial clearance to prevent interference with the bowing contact. The support layer 22 also has a support surface 42 which extends around the perimeter of the support layer 22. The support surface 42 provides a section in which to engage the side walls 20 to form the structure of the housing 12. The support surface 42 extends the periphery of the support layer 22 and the contact holes 40 will extend as an array across the entire surface of the support layer 22 with the exception of the support surface 42.

Electrical connector 10 is assembled by bringing the two support layers 22 towards each other and inserting the contacts 14 into the holes 40 on the two support layers 22. The ends of the contacts 14 are also inserted through the flexible membrane 18. The flexible membrane 18 can either have preslitted slots 44 (shown in FIG. 10) or the slots 44 could be formed during the assembly process when the ends of the contacts 14 are inserted through the flexible membrane 18. Sidewalls 20 are then inserted along the edges of the support plate 22 to keep the proper spacing between the two support plates 22. The spacer 20 can then be installed along the edge of the housing on top of the flexible member 18.

The support plate 22 is a rigid plate which could be made out of a molded plastic, or alternatively, the plate could be a punched part or laminate. The support plates 22 help to provide stiffness to the overall electrical connector structure and, when bonded to the flexible membranes 18, assist in mechanically decoupling the lateral motion of each contact from its neighbors, and assist in carrying wipe-reaction forces. The flexible membrane 18 is made as a thin polyimide membrane or some other material which would secure the contacts within the housing 12 but not provide significant structural support to the housing 12. The flexible member 18 can be made from polyester, polytetrafluoroethylene, or virtually any thin organic sheet depending on temperature, water absorption, and solvent resistance requirements. If the membrane is preslit, flexibility is not required and it could be fabricated as an integral part of the support plate 22. The flexible membrane 18 is supported on the surface of the support plate 22, however it is be understood that the flexible membrane 18 could be supported in some other manner, such as internal to the support plate 22 or disposed between two similar support plates 22. The slots 44 in the flexible membrane can be either preformed or alternatively the contacts form their own slots 44 during insertion by poking through the flexible membrane 18.

The sidewalls 20 are shown disposed completely around the outer sides of the housing 12. These sidewalls can also be made from a molded plastic material alternatively they could be made from other structures such as some other structure which will properly space the support plates 22 from each other. The sidewalls 20 do not need to extend along all sides of the housing 12. They may be disposed at select locations along the sides of the housing 12, such as at the corners, to keep the support plates 22 properly spaced while opening avenues for cooling of the metallic contacts. One advantage of having the sidewalls extend around the entire periphery of the housing is that the internal volume of the connector 10 is protected from the environment. However, if that protection is not needed in a particular application of the invention, it is possible to use less material to make the sidewalls.

Figure 11:
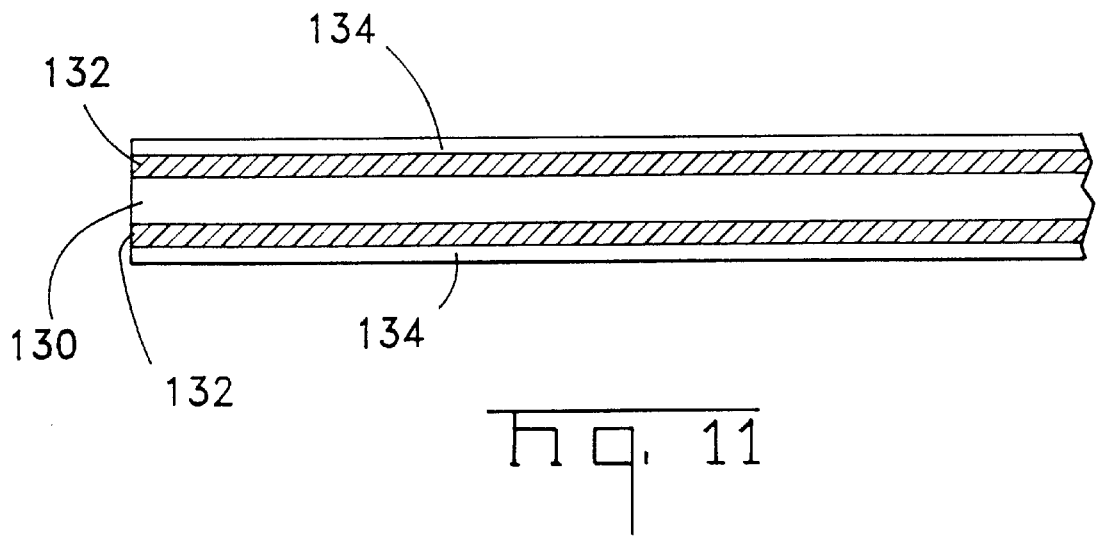
FIG. 11 shows an alternative embodiment of the support plate.
Figure 12:
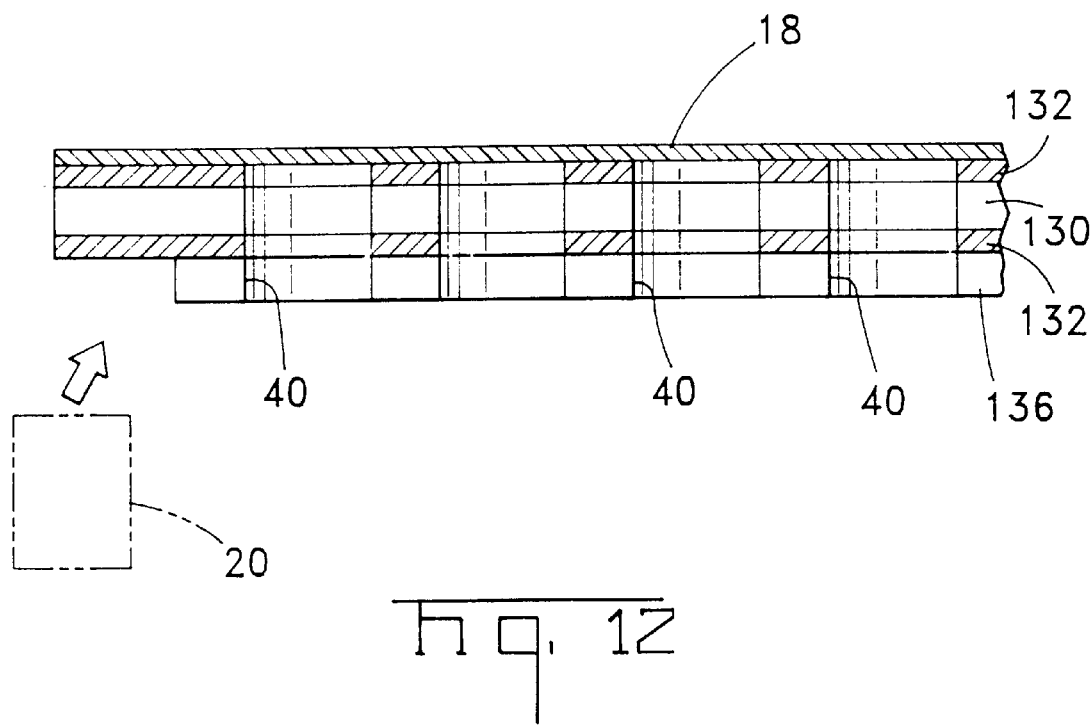
FIG. 12 shows the holes punched in the support plate and the flexible member added.

FIGS. 11 and 12 show an alternative way to prepare the support plates 22. In order to prepare the support plates 22, a central core 130 (shown in FIG. 11) has a layer of adhesive 132 on each side with a protective liner 134 to protect the adhesive layer 132. The central core 130 is typically in the shape of the final connector 10, however, it may be in a different shape and the shape of the connector 10 will be formed during the process. The protective liner 134 is first removed from one side of the central core 130 and a second core 136 (shown in FIG. 12) is placed along that side. The second core 136 only covers the portion of the support layer 22 which does not engage the sidewalls 20. A portion of the adhesive layer 132 will still be exposed so that the sidewalls 20 can be adhered to the support layer 22 during the final assembly of the connector 10, as shown in phantom in FIG. 12. Next, the holes 40 are punched through the central core 130, the two layers of adhesive 132, the protective liner 134 and the second core 136. Finally, the flexible member 18 is secured on the core 130 by first removing the protective liner 134 on the top of the core, as shown in FIG. 12, and applying the flexible membrane 18 to the exposed adhesive 132. The support layer 22 is then ready to be loaded with contacts 14 and to have the sidewalls 20 secured thereon.

The contacts 14 shown in FIGS. 3–5 are all spring contact plates which are simply thin, flat, nearly rectangular plates or columns which are free to rotate at each endpoint or contact point 32. Under axial mechanical loading, such a plate contact 14 remains in a flat state until a critical force is reached. At this point, the contact will elastically buckle. Past this critical buckling point, the requisite force is nearly independent of the amount of axial compression. Described in other terms, the buckled column is very nearly a constant force generator when compressed. This contrasts with conventional spring contacts when the displacement is linearly proportional to applied force. This bucking column force characteristic is particularly useful for electrical contacts, since the desired contact force is in principal available over the full range of contact travel. The limitation on axial travel and hence on interposer compliance is a build up of bending stress in the middle region of the column. The critical buckling force is determined in a well known manner from the column's thickness, length, width and material modulus of elasticity. Formulas for mechanical stress and for electrical self inductance of the contact are also well known, at least for simple geometries.

Design of the contact is a balance between the requirements of force, compliance, bow, pitch, inductance, and the limitations and cost of the chosen material. While not limited to such thickness, the thicknesses of the metal contacts 14 which are appropriate for this application are approximately 0.001 inches in thickness, and generally within the range of 0.0005 to 0.0015 inches. This thinness is an accommodation to various performance requirements, primarily the need to achieve a rather sharp bow in a short contact length. Beryllium copper, phosphor bronze, beryllium nickel, Co/Cr/Ni alloy, and various stainless steels, are all appropriate materials for these electrical contacts, provided the application can tolerate the high electrical resistance associated with some of these. A high yield strength and good conductivity are generally desired. The contacts can be formed by either etching or laser cutting, or stamping from a strip. The electrical contacts can be plated to provide satisfactory electrical performance. The electrical contact may be plated on and near the contact end. Plating near the highly-stressed central region tends to negatively influence the mechanical behavior of these very thin materials.

FIG. 7 shows the electrical connector 10 disposed between two devices 50 each of them having contact pads 52 disposed about one surface. The devices 50 could be circuit boards or any other device having an area array of contact pads. For example, the devices 50 could be a circuit board and an LGA device which is being mounted to the circuit board. Some type of clamping structure would be necessary to secure the LGA device and the electrical connector 10, as an interposer, between the LGA device and the circuit board. The devices 50 could also be an LGA chip and a BGA structure which is to be surface mounted onto a circuit board. The electrical connector 10, the BGA structure, and appropriate housing to secure the assembly together could be used as a socket assembly to mount the LGA chip onto a circuit board.

FIG. 7 shows the electrical connector 10 disposed, between the devices 50 such that the contacts 14 are not bowed in any way, that is the contacts 14 just begin to provide connection to the contact pads 52 and the buckling force has not yet been reached. As the devices 50 are brought closer together, the buckling force will be overcome and the contacts 14 will bow in as shown in FIG. 8. The sections close to the ends of the contacts 14 are supported by the flexible membrane 18 in the slit 44 so that the contact points 32 are free to move. During engagement of the contact 14 with the contact pads 52 the contact will begin to bow such that the middle portion 28 of the contact 14 will move laterally in one direction and the contact points 32 will move laterally in the opposite direction. The fixed point of the contact will be secured in the flexible membrane 18. During this process, the contact points of the contact 14 will move slightly across the surface of the contact pad 52 or will roll across the surface thereby providing a slight wiping action on the surface of the contact pad 52 and the edge of the contact 14. During the latter stages of axial contact travel, as the contact tips 32 approach the flexible membrane 18, this lateral wipe direction will be reversed so that ultimately the tips will coincide with the membrane slits 44. This wipe and reverse wipe provides a good electrical connection between the contact 14 and the contact pad 52.

The minimum pitch achievable in a buckling column contact array is determined by the contact width in one direction and the contact bow in the other direction. The contactbow is the amount of deflection of the contact from the straight position as shown in FIG. 7, and in phantom in FIG. 8, and the fully bowed position, shown in FIG. 8. While the plane of the bow is known, that is orthogonal to the original contact plane, what is not known is in what direction the contact 14 will bow. When a perfectly flat column contact is axially compressed the actual direction of bow is unpredictable. This means that a row of compressed contacts 14, viewed from the side, could look like a row of random parenthesis: for example ()))(()(()). The spacing would have to be at least double the amount of individual contact bow in order to prevent contact to contact interference. That is, to prevent the adjacent contacts 14 from engaging each other and shorting each other while in the bowed state, or from restricting their compression.

In some situations, it would be necessary to provide a closer pitch between the adjacent contacts. In this situation, it would be desirable to have the contacts 114 designed so that they will bow in a predetermined direction. Any out-of-plane asymmetry built into the contact which will consistently dominate other manufacturing variations will lead to a preferred bow direction. FIG. 9 shows one embodiment of such a contact 114 which will bow in a predetermined direction. Contact 114 has a arcuate surface 116 disposed in the middle 128 of a contact 114. The ends 130 of the contact 114 are both straight, that is orthogonal to the plane of the flexible membrane 18. In this situation when the devices 50 are pushed toward each other, the contact 114 will bow to the right, as shown in FIG. 9. A series of these contacts 114 can then be disposed within the electrical connector 10, all prebowed in the same direction, and they will all be bowed in that predetermined direction. This allows the contacts 114 to be spaced more closely together, face to face.

While FIG. 9 shows one embodiment of a prebowed contact, it is to be understood that the prebowed contact 114 can be formed in a variety of configurations all which would be interchangeable with the contact 114 shown in FIG. 9. For example, a central portion of the contact could be formed with a V therein, with a fold running across the central portion 128, or could be formed with some other arcuate shaped member. Alternatively, additional material could be applied to only one surface of the contact (by laminating or bonding) to produce the needed asymmetry. Any of these configurations would cause these contacts to bow in a predetermined direction.

While it is preferred to use the straight contacts, the prebowed contacts can be used in certain situations. When the contacts are prebowed, the individual contact force/deflection characteristic becomes more a conventional linear relationship, and the maximum force available from a particular contact is reduced. This, in turn, reduces total performance. It is generally desirable to guarantee the bow direction with the least asymmetry (prebow) which will reliably perform the task despite normal manufacturing variations.

The prebowed contacts 114 would be formed in the shaped shown in FIG. 9 prior to insertion within the electrical connector 10. The contacts 114 with the predetermined shape would then be secured within the electrical connector 10. The contacts 114 would be loaded within the connector in a relaxed position, that is the prebowed shape is put into the contact 114 and is not maintained by forces within the housing 12.

The structure of the housing 12 serves to position the electrical contacts 14 (or the prebowed contacts 114) in the proper location within the housing 12. Since the contacts 14 are so small and unstressed, very little force is required to hold these in position. Furthermore, the housing 12 does not add any stresses, such as prebowing the contacts in a certain direction. Once the devices 50 are terminated to either side of the electrical connector 10, the engagement of the ends of the contacts 14 with the contact pads 52 provide the force necessary to bow the contact. Therefore, the electrical connector housing 12 does not need to provide very much support for the individual contacts. The principal force requirement from the housing will be to resist evanescent "wipe" forces during contact mating. This will be particularly significant when employing "prebowed" contacts, such that these forces are all manifest in the same direction. This may make it beneficial to divide the full prebowed contact array into a "left-bowing" field and a "right-bowing" field (symmetrically divided down the middle of the contact array), so that these forces are balanced and appear as tension in the membrane/support-plate structure (18/22), rather than being transferred totally to the housing and its support structure.

FIG. 10 shows an alternative arrangement of the electrical contacts 14 within the housing 12. In this arrangement the slits 44 and the contacts 14 are disposed diagonally with respect to the columns of the contact array. This arrangement permits greater contact bow and less contact width without adjacent contact interference than does the complementary geometry wherein the individual contact plane is parallel to a column of the contact array. For some contact requirements, this is advantageous.

An advantage of the embodiment of the invention is that the contacts can be secured in a flexible member and not rigidly secured within the connector. The connector may be prototyped and manufactured in a variety of high density custom configurations without the use of intricate and unique capital mold tooling. This allows the connector to be made more cheaply and easily. A further advantage is that the connector can be made having a high contact density because little structure is needed to support the contacts. Electrical capacitance between contacts is reduced, and the capacity to accommodate forced or convective cooling of the contacts is available.

It is thought that the electrical connector of the present invention and many of its intended advantages will be understood from the foregoing description. It is apparent that various changes may be made in the form, construction, and arrangement of parts thereof, without departing from the spirit or scope of the invention without sacrificing all of its material advantages.

What is claimed is:

1. An electrical connector having a housing with a top surface and a bottom surface, an array of contacts being disposed within the housing, the contacts having middle sections and contact tips on either end of the contacts, the contacts being disposed within the housing such that the contact tips are exposed on the top and the bottom of the housing and the middle sections of the contacts being disposed in the interior of the housing, the contacts being secured to the top and bottom surfaces and being offset axially from the contact tips when said contacts are engaged, said contacts being in a straight line in a non-compressed condition before engagement and bent in a compressed condition during engagement.

2. The electrical connector of claim 1, wherein the contacts are buckling beam contacts, as contact pads are brought into engagement with the contact tips, at a certain point, the contacts will bow.

3. The electrical connector of claim 1, wherein the contacts have shoulders, the shoulders engage inner sides of the housing to secure the contacts within the housing.

4. The electrical connector of claim 1, wherein flexible membranes are disposed along the top and the bottom surfaces, the contacts being secured within the housing by engagement with the flexible membranes.

5. The electrical connector of claim 4, wherein the housing has support plates on which the flexible membrane is secured, the support plates have a plurality of holes therein through which the contacts extend.

6. The electrical connector of claim 5, wherein a sidewall separates the support plates from each other.

7. An electrical connector having a housing with a plurality of contacts secured therein, the housing having a top and a bottom surface, the contacts extend through the housing and outwardly from the top and bottom surface to provide a mating interface between contact tips of two electrical devices, the housing having a flexible member disposed along the top and the bottom surfaces and the contacts being secured within the housing by engagement with the flexible membrane, said contacts being offset axially from the contact tips when said contacts are engaged, said contacts being in a straight line in a non-compressed condition before engagement and bent in a compressed condition during engagement.

8. The electrical connector of claim 7, wherein the contacts are buckling beam contacts, as contact pads are brought into engagement with contact tips, at a certain point, the contacts will bow.

9. The electrical connector of claim 7, wherein the contacts have shoulders, the shoulders engage inner sides of the housing to secure the contacts within the housing.

10. The electrical connector of claim 7, wherein the housing has support plates on which the flexible membrane is secured, the support plates have a plurality of holes therein through which the contacts extend.

11. The electrical connector of claim 10, wherein a sidewall separates the support plates from each other.

12. An electrical connector having a housing with a plurality of contacts secured therein, the housing hating a top and a bottom surface, the contacts having middle sections and contact tips on either end of the contacts, the contacts extend through the housing and outwardly from the top and bottom surfaces such that the contact tips are exposed on the top and the bottom of the housing and the middle sections of the contacts being disposed in the interior of the housing to provide a mating interface between two electrical devices, the housing having a flexible member disposed along the top and the bottom surfaces and the contacts being secured within the housing by engagement with the flexible membrane and offset axially from the contact tips when said contacts are engaged, said contacts being in a straight line in a non-compresses condition before engagement and bent in a compressed condition during engagement.

13. The electrical connector of claim 12, wherein the housing has support plates on which the flexible membrane is secured, the support plates have a plurality of holes therein through which the contacts extend.

14. The electrical connector of claim 13, wherein a sidewall separates the support plates from each other.

15. An electrical connector, comprising a housing having a top and a bottom surface, the top and the bottom surfaces each having a flexible membrane disposed thereover, the housing having a plurality of contacts disposed therein, the contacts being secured in a straight line in a non-compressed condition prior to any engagement thereof between the flexible membranes with contact tips extending through the flexible membranes for engagement with contact pads along both sides of the housing, the contacts being buckling beams, whereby as the contact tips engage contact pads on both sides, at a certain point, the contacts and their tips will bend and bow and be axially offset from the contact pads when engaged therewith.

16. The electrical connector of claim 15, wherein the housing has support plates on which the flexible membrane is secured, the support plates have a plurality of holes therein through which the contacts extend.

17. The electrical connector of claim 16, wherein a sidewall separates the support plates from each other.

* * * * *